US008816718B1

(12) United States Patent
Han et al.

(10) Patent No.: US 8,816,718 B1
(45) Date of Patent: Aug. 26, 2014

(54) VARIABLE RESPONSE MODE FOR SYNCHRONOUS DATA READ

(75) Inventors: Wei Han, Beaverton, OR (US); Zheng Chen, Upper Macungie, PA (US); Warren Juenemann, Cornelius, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 70 days.

(21) Appl. No.: 13/038,270

(22) Filed: Mar. 1, 2011

(51) Int. Cl.
*H03K 19/177* (2006.01)

(52) U.S. Cl.
USPC .......................................................... 326/39

(58) Field of Classification Search
USPC ............................................ 326/37–47, 101
See application file for complete search history.

(56) References Cited

U.S. PATENT DOCUMENTS

| 5,440,515 | A | 8/1995 | Chang et al. |
| 6,185,128 | B1 | 2/2001 | Chen et al. |
| 6,879,535 | B1 | 4/2005 | Perisetty |
| 6,891,774 | B1 | 5/2005 | Abdollahi-Alibeik et al. |
| 7,646,658 | B2 | 1/2010 | Chen et al. |
| 7,929,356 | B2 * | 4/2011 | De Caro et al. .......... 365/189.05 |
| 2010/0014357 | A1 * | 1/2010 | Landry et al. ............ 365/185.25 |
| 2010/0061152 | A1 | 3/2010 | De Caro et al. |

* cited by examiner

*Primary Examiner* — Thienvu Tran

(57) ABSTRACT

In one embodiment, a programmable logic device includes a memory and an input/output (I/O) interface adapted to enter a variable response mode responsive to an assertion of a control signal. The I/O interface is operable in the variable response mode to respond to a read command from an external device by retrieving data from the memory and to shift dummy data to the external device until an internal data ready signal is asserted.

19 Claims, 2 Drawing Sheets

VARIABLE RESPONSE MODE FOR SYNCHRONOUS DATA READ

TECHNICAL FIELD

The present invention relates generally to programmable logic devices and, more particularly, to a programmable logic device having a variable response mode for synchronous data reads.

BACKGROUND

Programmable logic devices such as field programmable gate arrays (FPGAs) and complex programmable logic devices (CPLDs) allow a designer to avoid the expense of constructing an ASIC to implement a desired function. Moreover, a user may update a system by reprogramming its embedded programmable logic device rather than go through the expense of a new hardware design. Thus, programmable logic devices (PLDs) are a common design component. To allow communication with other components in a system, PLDs will typically include input/output (I/O) ports supporting common communication protocols such as Serial Peripheral Interface (SPI) or Inter-Integrated Circuit ($I^2C$). As known in the integrated circuit arts, SPI and $I^2C$ are conventional serial bus protocols for serial data communication between integrated circuits (and intra-chip in some implementations).

In both protocols, data is shifted into and out of the PLD according to a master clock supplied by a master device. For example, the master device may be a host PC that needs to read some information from an embedded memory in the PLD. The desired data is then shifted out of the PLD one bit at a time responsive to cycles of the master clock. In general, it takes some time for a PLD to respond to such a memory read request. However, the port protocols such as SPI and $I^2C$ require data to be shifted out at each clock cycle. Thus, it is conventional for the PLD to be configured such that it first shifts out dummy bits (having don't care values) prior to shifting out the actual data. For example, the master device will expect the actual data at some pre-agreed-upon clock cycle such that a predetermined number of dummy bytes are first provided by the PLD. The fixed amount of dummy data that is shifted out must accommodate the worst case scenario such that in many situations some portion of the dummy bytes are unnecessary. Such a fixed amount of dummy data is inefficient and makes the various read commands inconsistent.

Accordingly, there is a need in the art for an improved command execution protocol for synchronous data reads.

SUMMARY

In accordance with a first embodiment, a programmable logic device, is provided that includes a memory; and an input/output (I/O) interface adapted to enter a variable response mode responsive to an assertion of a control signal, wherein the I/O interface is operable in the variable response mode to respond to a read command from an external device by retrieving data from the memory and to shift dummy data to the external device until an internal data ready signal is asserted.

In accordance with a second embodiment, a programmable logic device is provided that includes a memory; an input/output (I/O) interface adapted to respond to a read command from an external device by retrieving data from the memory, wherein the I/O interface is further adapted to monitor an internal data ready signal and to shift out dummy data to the external device until the internal data ready signal is asserted.

In accordance with a third embodiment, a method is provided that comprises receiving a read command from an external device at a programmable logic device's input/output (I/O) interface, wherein the read command commands the I/O interface to retrieve data from a memory in the programmable logic device; providing an internal data ready signal that is asserted after the data is retrieved from the memory; while the internal data ready signal is de-asserted, shifting dummy data out of the I/O interface to the external device; and after the internal data ready signal is asserted, shifting the retrieved data out of the I/O interface to the external device.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The present invention relates to a read command execution protocol that provides a variable amount of dummy data during synchronous data reads. The following disclosure will address a Serial Peripheral Interface (SPI) implementation for this protocol but it will be appreciated that the disclosed protocol is readily adapted for other synchronous read protocols such as Inter-Integrated Circuit ($I^2C$). Moreover, the SPI slave device for the following discussion will be a field programmable gate array (FPGA) but the read command execution protocol disclosed herein may be implemented in any generic slave SPI device.

Figure 1:
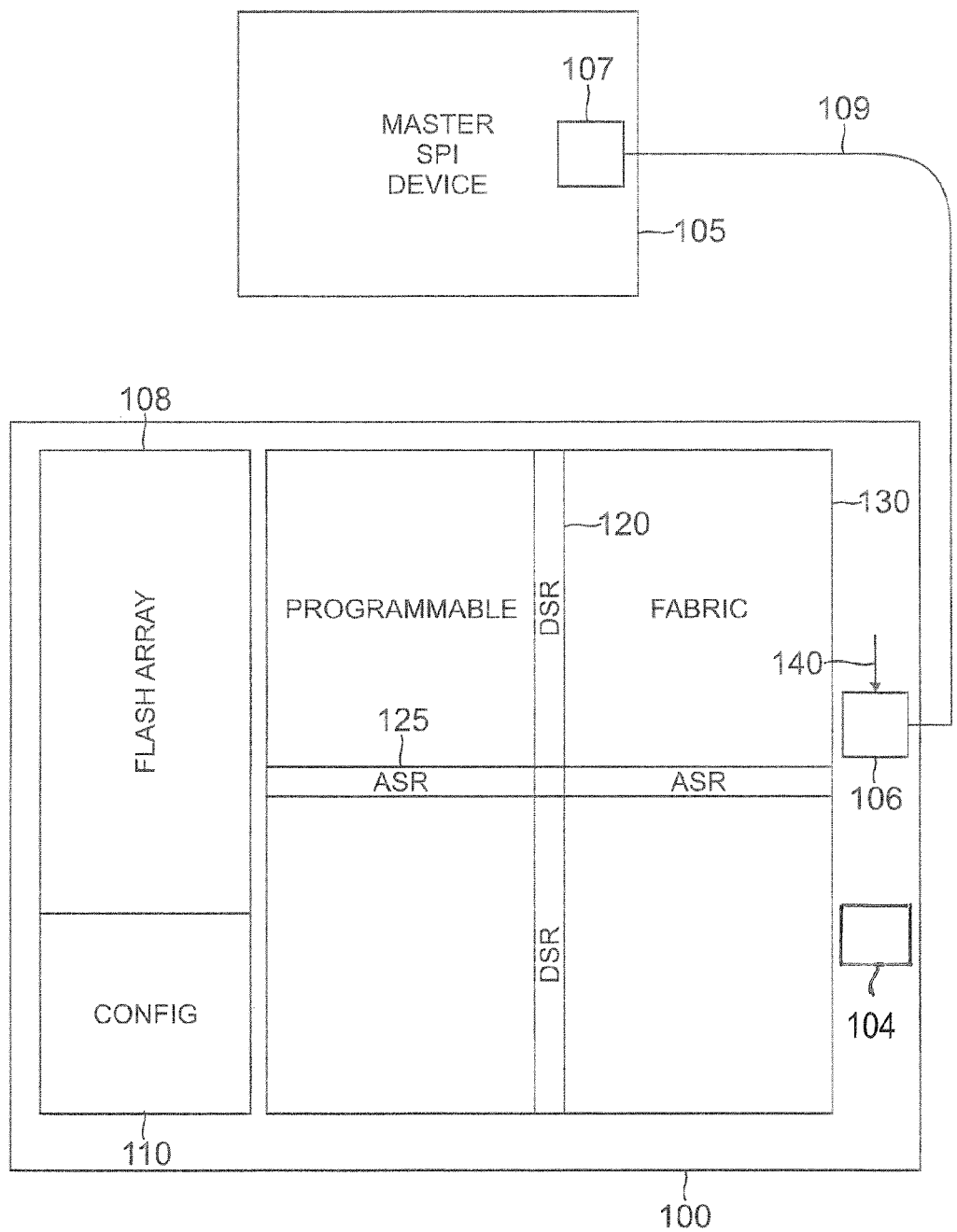
FIG. 1 is a block diagram of an FPGA and a boot ROM configured to implement a variable delay read in accordance with an embodiment of the invention.

Referring now to FIG. 1 of the drawings, an FPGA 100 operates as a SPI (conventionally pronounced as "spy") slave device to a SPI master device 105 such as a host processor. Thus, FPGA 100 includes a slave SPI interface 106 whereas SPI master device 105 includes a master SPI interface 107. FPGA 100 also includes a control register 104 operable to store a control bit (or bits) that functions to configure slave SPI interface 106 into a variable response mode as will be further described herein. As known in the FPGA arts, FPGA 100 includes a non-volatile memory such as flash memory 108 to store configuration data. To load the configuration data into the device, an FPGA programming tool may shift the configuration data into a data shift register (DSR) 120. When the DSR is thus filled with a word of configuration data, the resulting configuration data word is shifted out of DSR into a volatile memory such as a configuration SRAM 110 according to an address from an address shift register (ASR) 125. In this fashion, configuration data is shifted into SRAM 110 a data word at a time from the programming tool. Alternatively, the configuration data may be loaded into flash 108 so that FPGA 100 stores the configuration data in a non-volatile fashion. During normal operation, a programmable fabric 130 in the FPGA would then operate according to the stored configuration data. Not only does the programming tool thus configure the programmable fabric but it also writes critical information such as encryption keys into embedded memories within the programmable fabric. For example, the present assignee of this application designates certain embedded memories as Embedded Block Rams (EBRs). Execution of writes and reads to the flash, to the SRAM, and to embedded memories will in general require differing amounts of time.

The master SPI device may occasionally need to read data from the flash, the SRAM and the embedded memories. Just like the writing of data under the SPI protocol, a SPI read occurs synchronously with a SPI clock common to both SPI interfaces. Under the SPI protocol, the slave SPI interface shifts out a bit of data at each cycle of the SPI clock through the SPI bus and into the master SPI interface. Because SPI is a full duplex protocol, the master SPI interface shifts out a bit of data at each cycle of the SPI clock as well during SPI data exchanges.

As known in the SPI arts, the master device performs a read or write operation by first issuing a command to the slave device—the following discussion will assume without loss of generality that such a read command is four bytes long such that it would take thirty-two SPI clock cycles to serially shift the four-byte read command a bit at a time into the slave device's SPI interface. Since the read command is thus fully shifted into the slave after thirty-two SPI clock cycles, a master device expects to receive data at the thirty-third SPI clock cycle.

In general, a SPI slave device such as FPGA 100 cannot be expected to shift out a data bit at the next SPI clock cycle (in the above example, the $33^{rd}$ clock cycle) after a read request has been received from the master device. In particular, the retrieval of data from a non-volatile memory is typically slow as compared to the SPI clock rate. But the SPI protocol demands that a bit of data is shifted out at each SPI clock cycle after receipt of the read command. Thus, it is conventional for a SPI slave device such as FPGA 100 to initially shift out dummy bits (designated as "dummy" bits because the data value has no use or importance) responsive to a master device read request. The master device, however, needs to know when to expect to receive the real data as opposed to the dummy bits.

A conventional SPI interface is thus configured to shift out a predetermined number of dummy bits after receipt of a read command. This predetermined number is chosen according to a worst case scenario—in other words, according to the greatest expected delay for retrieving the requested data from the various memories such as the flash, the SRAM, and the embedded memories. For purposes of discussion, the corresponding number of SPI clock cycles for this worst-case delay may be designated as some positive integer "N." A conventional SPI interface for a slave FPGA would thus shift out N bits of dummy data responsive to a read request. These N dummy bits are shifted out regardless of whether the actual read operation requires substantially less than N SPI clock cycles. Similarly, a conventional SPI interface for the master device is configured to expect this predetermined number of dummy bits (it is convenient to select this predetermined number to define a certain number of bytes).

The slave and master SPI interfaces disclosed herein are configurable to free their operation from such a fixed amount of dummy bytes. To enable such an advantageous result, the slave SPI interface is configurable to enter a variable response mode. In one embodiment, the slave SPI interface variable response mode operation is active in response to the assertion of a control signal such as an asserted control bit stored in register 104. With this control bit asserted such that the variable response mode is active, the slave SPI interface monitors a data ready indication signal 140 that indicates that data corresponding to a non-volatile memory read from the flash (or an embedded memory) is ready to be delivered. Once the configured slave SPI interface receives a data ready indication from signal 140, it may then deliver the actual data instead of dummy data. However, the master SPI interface needs some way of knowing that the slave SPI interface is now going to deliver actual data. Thus, the slave SPI interface is configured to shift out a flag byte after signal 140 is asserted. For example, suppose the slave SPI interface has just shifted out the fourth bit of a current dummy byte when signal 140 is asserted. The slave SPI interface will thus finish the shifting out of that current dummy byte by shifting out its final four bits. The next bit the slave SPI interface shifts out will be the first bit of the flag byte, which may be designated as a Data Valid Indicator (DVI) byte. The slave SPI interface may then finish shifting out the DVI byte and deliver the data bytes. As discussed above, all such data shifting occurs a bit at a time responsive to the SPI clock. The master SPI interface is thus configured to recognize the DVI byte so that it expects real data bytes after receipt of the DVI byte.

Figure 2:
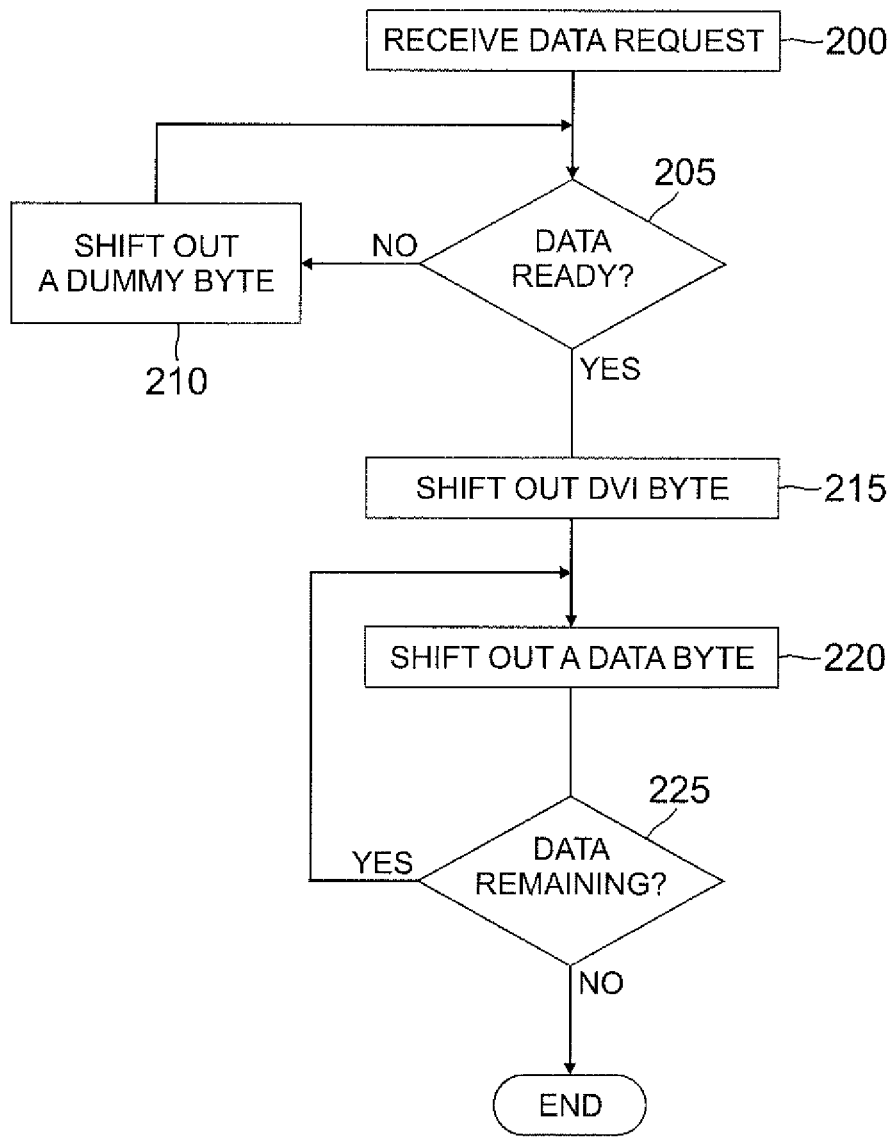
FIG. 2 is a flow chart for a variable read delay implemented by the slave SPI interface of FIG. 1.

A flowchart for a variable response procedure implemented by an embodiment of the slave SPI interface is shown in FIG. 2. At step 200, the slave SPI interface has received a read command from the master SPI interface in the master device. For example, should the read command comprise four bytes, the read command is shifted into the slave SPI interface over thirty-two SPI clock cycles. It is conceivable that FPGA 100 could be so fast that the corresponding data would be ready prior to the next SPI clock cycle. Or perhaps the SPI clock rate is much faster than the internal read rate such that many SPI clock cycles elapse before the data is ready. As will be explained further herein, the variable response procedure of FIG. 2 accommodates such a variable amount of delay. In a step 205, the slave SPI interface checks the status of signal 140 to determine if the data is ready to be transmitted back to the master SPI interface. If data is not ready, the slave SPI interface executes a step 210 by shifting out a dummy byte. Step 205 is then again executed such that the slave SPI interface consecutively shifts out dummy bytes while the data is still being retrieved from memory.

When signal 140 indicates that the data has been retrieved from memory (such as from the flash, the configuration SRAM, or from an embedded memory), the slave SPI interface shifts out the DVI byte in a step 215. The slave SPI interface may then shift out a data byte in a step 220. Should the slave SPI interface have data remaining to shift out as determined in a step 225, the remaining data bytes are shifted out by consecutively repeating step 220. Should no data remain, the variable response procedure is completed.

It will be appreciated that a slave SPI interface implementing the variable delay read procedure discussed with regard to FIG. 2 will shift out an integer "n" number of dummy bytes, wherein n is an integer greater than or equal to zero. The special case of zero dummy bytes would occur if FPGA 100 were so fast that a positive result for step 205 is reached prior to the next SPI clock cycle after completion of step 200. The number of data bytes shifted out in step 220 depends upon the type of flash and embedded memory being accessed. For example, in one embodiment, each read command for the flash retrieves sixteen bytes of data whereas each read command for an embedded memory retrieves nine bytes of data.

In other words, data is retrieved a word at a time and the word size for the flash in this example embodiment is sixteen bytes whereas the word size for the embedded memory is nine bytes. Advantageously, the read back of data from the FPGA to the master device is thus freed from the SPI clock rate: in other words, it doesn't matter if the SPI clock rate is fast or slow in comparison to the FPGA memory read time because the variable delay accommodates all such variations.

The master and slave SPI interfaces can also be configured for conventional operation such that a fixed amount of dummy bytes is implemented such as through a de-assertion of the control bit stored in register 104. Thus, the control bit (or multiple bits) can control whether the variable response procedure or conventional operation occurs.

Accordingly, the above-described embodiment of the present invention is but one example of many possible embodiments. For example, in another embodiment the I/O interface can be constructed such that the interface monitors data ready indication signal 140 without a prompt from a control signal. It will thus be apparent to those skilled in the art that various changes and modifications may be made to what has been disclosed without departing from this invention. The appended claims encompass all such changes and modifications as fall within the true spirit and scope of this invention.

We claim:

1. A programmable logic device, comprising:
   a memory;
   an input/output (I/O) interface adapted to respond to a read command received from an external device by retrieving data from the memory, wherein the I/O interface is further adapted to monitor an internal data ready signal asserted by the programmable logic device and to shift out dummy data to the external device from the receiving of the read command until the internal data ready signal is asserted; and
   a control register operable to store a control bit signal that enables the I/O interface to monitor the internal data ready signal.

2. The programmable logic device of claim 1, wherein the I/O interface is further adapted to shift out the retrieved data to the external device after the data ready signal is asserted.

3. The programmable logic device of claim 2, wherein the I/O interface is further adapted to shift out an external data ready signal to the external device before shifting out the retrieved data.

4. The programmable logic device of claim 3, wherein the external data ready signal is a one-byte signal.

5. The programmable logic device of claim 1, wherein the memory is a flash memory.

6. The programmable logic device of claim 1, wherein the memory is an embedded memory.

7. The programmable logic device of claim 1, wherein the programmable logic device is a field programmable gate array (FPGA).

8. A method, comprising:
   receiving a read command from an external device at a programmable logic device's input/output (I/O) interface, wherein the read command commands the I/O interface to retrieve data from a memory in the programmable logic device;
   monitoring an internal data ready signal from a control bit signal stored in a control register within the programmable logic device, the internal data ready signal being asserted by the programmable logic device after the data is retrieved from the memory;
   after receiving the read command and before the internal data ready signal is asserted, shifting dummy data out of the I/O interface to the external device; and
   after the internal data ready signal is asserted, shifting the retrieved data out of the I/O interface to the external device.

9. The method of claim 8, further comprising shifting an external data ready signal out of the I/O interface to the external device before shifting the retrieved data.

10. The method of claim 8, wherein the programmable logic device is a field programmable gate array (FPGA).

11. The method of claim 8, wherein the I/O interface is a SPI interface.

12. The method of claim 8, wherein the external device is a host processor having a master SPI interface and the I/O interface is a slave SPI interface.

13. A logic device, comprising:
    a memory;
    an input/output (I/O) interface adapted to respond to a read command received from an external device by retrieving data from the memory, wherein the I/O interface is further adapted to monitor an internal data ready signal asserted by the logic device and to shift out dummy data to the external device from the receiving of the read command until the internal data ready signal is asserted; and
    a control register operable to store a control bit signal that enables the I/O interface to monitor the internal data ready signal.

14. The logic device of claim 13, wherein the I/O interface is further adapted to shift out the retrieved data to the external device after the data ready signal is asserted.

15. The logic device of claim 14, wherein the I/O interface is further adapted to shift out an external data ready signal to the external device before shifting out the retrieved data.

16. The logic device of claim 15, wherein the external data ready signal is a one-byte signal.

17. The logic device of claim 13, wherein the memory is a flash memory.

18. The logic device of claim 13, wherein the memory is an embedded memory.

19. The logic device of claim 13, wherein the I/O interface is a SPI interface.

* * * * *